United States Patent [19]

Konishi et al.

[11] Patent Number: 4,511,758

[45] Date of Patent: Apr. 16, 1985

[54] REDUCTION OF MESSAGE LENGTH IN A COMMUNICATION SYSTEM

[75] Inventors: Kazunori Konishi, Kawasaki; Akira Kurematsu, Yokohama, both of Japan

[73] Assignee: Kokusai Denshin Denwa Co., Ltd., Tokyo, Japan

[21] Appl. No.: 486,917

[22] Filed: Apr. 20, 1983

[30] Foreign Application Priority Data

Apr. 22, 1982 [JP] Japan .................................. 57-66369

[51] Int. Cl.³ .............................................. H04L 3/00
[52] U.S. Cl. ........................................ 178/2 B; 178/79; 178/17.5
[58] Field of Search ................... 178/2 B, 26 A, 26 R, 178/30, 79, 113, 4, 17.5

[56] References Cited
U.S. PATENT DOCUMENTS

4,107,457 8/1978 Hajduk ................................. 178/79

Primary Examiner—Stafford D. Schreyer
Attorney, Agent, or Firm—Armstrong, Nikaido, Marmelstein & Kubovcik

[57] ABSTRACT

In a message communication system and process, a character string with a plurality of characters is encoded into a compact code, which is transmitted to a reception side. At the reception side, the compact code is decoded to an original character string. Thus, the amount of information to be transmitted is fairly reduced as compared with the transmission in which each character is encoded. Preferably, a combination of a word and a 'space' code following the word is encoded to a single compact code. The compact code may also encode a combination of a plurality of words. Some particular control codes are defined for converting a small character to a capital character, or vice versa, and designating special code like period ".", quotation mark "?", etc.

5 Claims, 5 Drawing Figures

REDUCTION OF MESSAGE LENGTH IN A COMMUNICATION SYSTEM

BACKGROUND OF THE INVENTION

This invention relates to a communication system and process for a document composed of alpha-numeric letters.

Conventionally, in this type of communication, a document communication is performed by encoding a character as the unit for conversion in accordance with the code table such as International Telegraphic Alphabet No. 2 or International Alphabet No. 5 or others and then transmitting these codes in sequential order. In such a communication system as the above, however, there exists a defect in efficiency because the redundancy provided with the document is transmitted as it is.

SUMMARY OF THE INVENTION

Consequently, the object of this invention is to improve the above defect in the prior art and to enhance the encoding efficiency by utilizing the statistical property provided in a document, and resultantly to make it possible to reduce the communication cost.

The above and other features are attained by a communication process between a transmission side and a reception side comprising the steps of; (a) at the transmission side, comparing a character string of the message to be transmitted with a dictionary, and encoding said character string to a compact code according to the content of the dictionary; (b) sending the encoded compact code to a reception side; (c) at the reception side, decoding the encoded compact code with the dictionary which has the same content as that of the transmission side; and (d) wherein said dictionary is an electronic controllel dictionary with a memory.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

According to a preferred embodiment of the present invention, the character string including a word tail followed by a space immediately after it has previously being registered in a dictionary together with one of said spaces, on the transmitter side, in case a space appears immediately after the character string including said word tail, said compact code corresponding to the character string including said word tail is transmitted if any previously defined special symbol is not immediately suceeding to said one space. Otherwise, if any peviously defined special symbol is immediately succeeding to said one space, said compact code corresponding to said space is added to said compact code corresponding to the character string including said word tail and then is transmitted. On receiver side, on the other hand, for the code corresponding to the character string including said word tail, when a code corresponding to the character other than said special symbol is received immediately after receiving said code, the word together with the space on its tail are decoded in accordance with the way by which it is registered in said dictionary, in the meantime, when the code corresponding to said special symbol is received immediately after that, the space on the tail of character string including said word tail registered in said dictionary is deleted and then the word decoding will be proceeded with.

By another embodiment of the present invention, the deletion code to delete the space on the tail of the character string including the word tail registered in said dictionary on the receiver side is previously defined, on the transmitter side, when the character string including the word tail appears on a position other than that of the word tail, said deletion code is added to the character string including said word tail and then the word transmission is proceeded with. On the receiver side, in the meantime, when said deletion code is received in accordance with the code corresponding to the character string including said word tail, one of the spaces on the tail of the character string including said word tail registered in the dictionary is deleted and then the word decoding will be proceeded with.

By further embodiment of the present invention, a headletter conversion code to convert the headletter of a character string from its small letter to capital letter on the receiver side is previously defined, while, on the transmitter side, when a character string appearing on a document is not registered in a dictionary as it is, has a capital letter for only the headletter, and coincides with the character string except said capital letter and said small letter, said headletter conversion code together with the code obtainable based on the principle of the most coincided in length are added, and then the transmission is proceeded with. On the receiver side, in the meantime, when side headletter conversion code is received in association with the code of said character string, said headletter of said character string is converted from small letter to the corresponding capital letter.

By a further embodiment of the present invention, a letter string conversion code to convert a character string on the receiver side entirely from small letters to capital letters is previously defined, while on the transmitter side, when the character string appearing on a document is composed of all the capital letters, is not registered in a dictionary as it is, and coincides with the character string registered if all the capital letters are converted to the corresponding small letters, said letter string conversion code together with the code obtainable based on the principle of the most coincided in length are added and, then, the transmission is proceeded with. On the receiver side, in the meantime, when said letter string conversion code is received in association with the code of said character string, said character string is entirely converted from the small letters to the corresponding capital letters.

Figure 1:
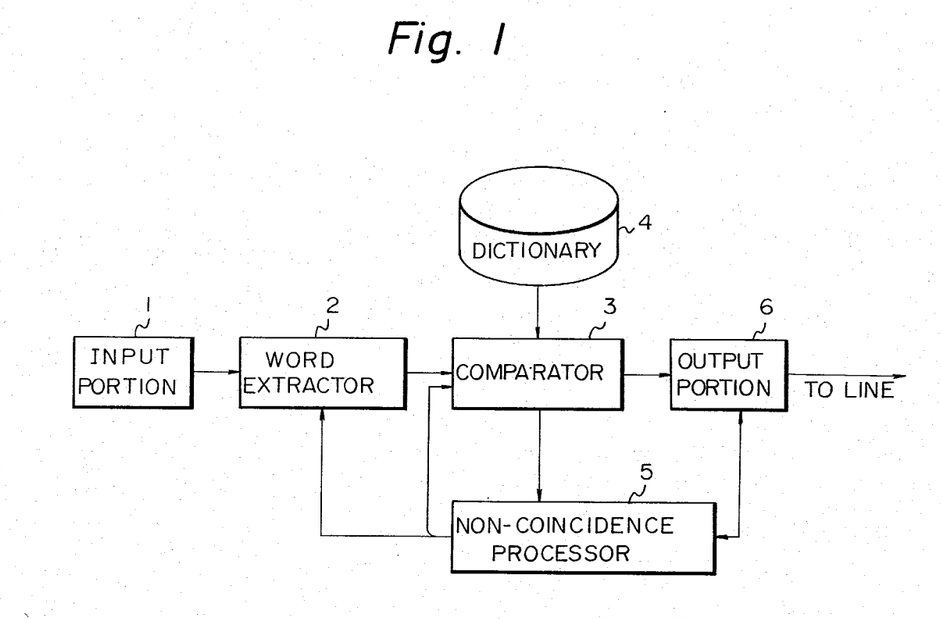
FIG. 1 is a block diagram of the transmitter in accordance with the present invention.

FIG. 1 shows a block diagram of the transmitter.

Figure 2:
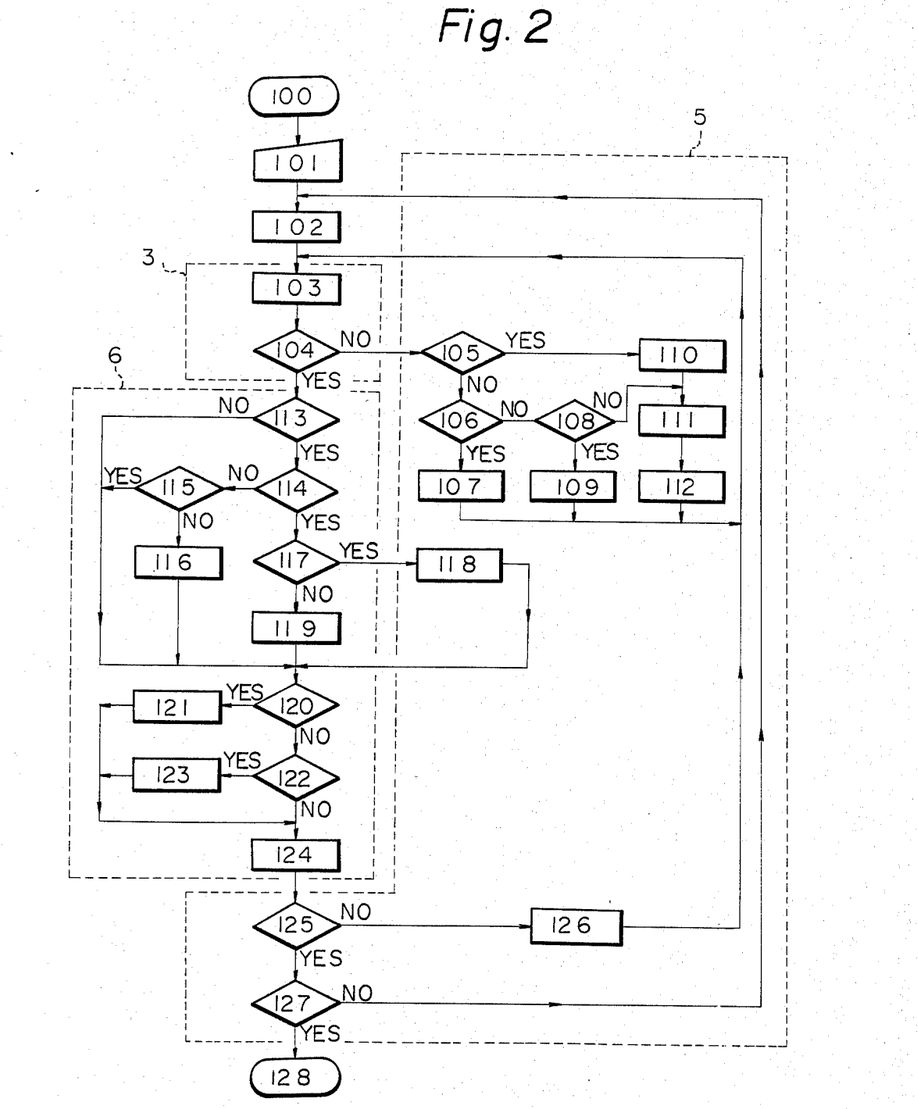
FIG. 2 is a flow diagram describing the motions in FIG. 1.

FIG. 2 shows a flow diagram describing the operation of each portion in FIG. 1.

Table 1 is a table describing the contents of actions made by each portion in FIG. 2.

Table 2 is an example showing a part of the compact code table in the dictionary.

Figure 3:
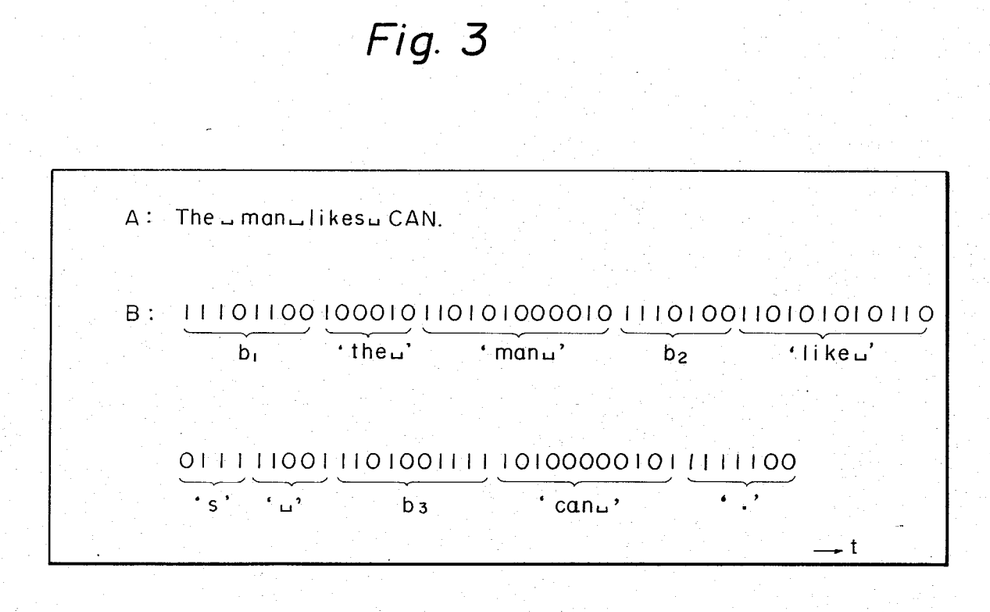
FIG. 3 is a diagram showing a transmitting document and its code example.

FIG. 3 shows an example of the transmitting codes by which a transmitting document will be converted in accordance with the figures and/or tables mentioned herein.

TABLE 1

| No. | CONTENTS |
|---|---|
| 100 | Start |
| 101 | Input a transmitting document |
| 102 | Extract a collating word and next one character |
| 103 | Collate with dictionary (ignoring spaces at tail) |
| 104 | Does collating word exist within dictionary ? |
| 105 | Is there a record of conversion from capital to lower case letter for the head or all the characters ? |
| 106 | Is only the head character a capital letter ? |
| 107 | Convert the head character from capital to lower case letter and memorize this convension record |
| 108 | Are all the characters capital letters ? |
| 109 | Convert all the character from capital to lower case letters and memorize this conversion record |
| 110 | Return the status to the one before conversion from capital to lower case letters |
| 111 | Store one character at the tail of a character string in sequential order |
| 112 | Extract characters after excluding the one character at the tail of a character string |
| 113 | Is this a character string that may appear at a word tail ? |
| 114 | Is there any space at the tail of a character string to be collated ? |
| 115 | Is any special symbol succeeding to ? |
| 116 | Add deletion code |
| 117 | Is any special symbol succeeding to ? |
| 118 | Store space as the tail character of a character string |
| 119 | Include the tail space of a character string into the character string |
| 120 | Is this a character string converting its head character from capital to lower case letter ? |
| 121 | Add headletter conversion code |
| 122 | Is this a character string converting all its characters from capital to lower case letters ? |
| 123 | Add letter string conversion code |
| 124 | Output transmitting code |
| 125 | Has entire encoding for collating word been completed ? |
| 126 | Extract the tail character stored sequentially |
| 127 | Has encoding for a transmitting document been completed ? |
| 128 | End |

TABLE 2

| character (string) | compact code | code length (in bits) |
|---|---|---|
| s | 0111 | 4 |
| _ | 11001 | 5 |
| the_ | 100010 | 6 |
| . | 1111100 | 7 |
| deletion code | 1110100 | 7 |
| headletter conversion code | 11101100 | 8 |
| letter string conversion code | 1101001111 | 10 |
| can_ | 10100000101 | 11 |
| like_ | 110101010110 | 12 |
| man_ | 110101000010 | 12 |

After being processed through input portion 1 (corresponding to 101 in FIG. 2) in FIG. 1 by means of a keyboard or others, a transmitting document is separated into a string of words by the unit of word on word extractor 2 (corresponding to 102 in FIG. 2) and is then transmitted to collator 3. In order to simplify the description, hereafter, one "word" is assumed to mean a series of character string composed of only alphabet, or, each of one character such as a special symbol (comma, dot, etc) and/or a figure. A word is collated with dictionary 4 at collator 3. If there is a character string coincided with, the compact code corresponding to this in dictionary 4 is extracted therefrom, and this is transmitted to output portion 6, and then this is transmitted out to the receiver side as a transmitting code string. On the other hand, if there is not a character string coinciding in the dictionary 4, comparison is accomplished by deleting the extreme tail character from said word sequentially one after another in dictionary 4 until the coincidence is obtained. Said deletion of the extreme tail character is carried out in the non-coincidence processor 5. When said collation is completed and its compact code is then output, the characters which have been excluded up to that time are returned to input to collator 3 again, and the encoding process is repeated.

As an example of compact code, the Huffman code is widely known. After extracting characters from top 200 words (including spaces on a word tail) with the higher frequencies of appearances in English magazines and from the words other than those, the Huffman code-table was produced according to these frequencies of appearances. FIG. 2 shows an example of Huffman code-table. Following is the detailed description about how the transmitting document in FIG. 3 is encoded based on Table 2 and the flow diagram of table 1. Moreover, in FIG. 3, the "A" denotes a transmitting document, the "B" denotes the transmitting codes, $b_1$ denotes a headletter conversion code, $b_2$ denotes deletion code, and finally $b_3$ denotes letter string conversion code.

When the head word "The_" of the transmitting document is produced at input portion 1 (101), then, the collating word "The_" and the next one character "m" are extracted at word extractor 2 (102), and they are transmitted to collator 3. At collator 3, the collating word "The_" is collated with dictionary 4 (103), nevertheless, since no coincided word was found (104 in Table 2), The collating word "The_" is transmitted to non-coincidence processor 5.

At non-coincidence processor 5, at first, checking is made to see whether or not there is a past conversion record for a collating word from capital to a small letter (105). Since there is no past conversion record yet, checking will be made accordingly to see whether only the head character is a capital letter (106), or, all the characters are capital letters (108).

If there exists a capital letter, this will be converted to the corresponding small letter and also this conversion record will be memorized (107 and 109). Since the collating word "The_" has here a capital letter at its head, this is converted to "the_" (107) and is then returned to collator 3 (103). Since new collating word "the_" is being registered in the dictionary 4 (Table 2), it is transmitted to output portion 6, and is checked if it is the character string which becomes the word tail having space (_) at the tail (113), because it has, in fact, a space at its tail (114), and moreover, character "m" succeeding to collating word "the_" is checked and hence this is not any special symbol (117), encoding is performed with the space (_) at the tail included in the character string (that is, just the same as the contents of the dictionary) (119). Since the collating word "the_" is the character string whose head character was converted from capital to small letter (120), the headletter conversion code ($b_1$) is added (121) and is output as a transmitting code (124). That is to say, resultantly, based on Table 2, the headletter conversion code (11101100) and then the collating word "the_" (100010) are to be transmitted sequentially.

On the other hand, if the collating word is the one whose entire characters were converted from capital to small letters, the letter string conversion code is added (122 and 123).

Thus, encoding word "The_" extracted initially as the word to be collated is now completed entirely (125), but the further words are still remaining (127). The word extractor 2 is then driven again and a new collating word "man_" and the next one character "l" will be extracted (102). The code (110101000010) in the dictionary 4 is output in this case from the following reasons: (1) "man_" is registered in the dictionary 4 (Table 2); (2) this character string is the one to be able to be the word tail (113); (3) There is a space at its tail; (4) any special symbol is not succeeding (117), and (5) finally, there is no record of conversion from capital to small letter (120 and 122).

Likewise, new collating word "likes_" and the next one character "C" will be extracted (102). Since "likes_" does not exist in the dictionary 4 (104 in Table 2), they are transmitted to non-coincidence processor 5. At non-coincidence processor 5, it is at first checked whether or not there is a past conversion record from capital to small letter (105). If there is, in order to simplify the processing here, the status is to be returned directly to the one before the conversion from capital to small letter (110). As collating word "like_" has no record of past conversion from capital to small letter (105) and does not contain any capital letter (106 and 108), one character "_" at the tail of the character string is stored (111), and at the same time, "likes", the remaining character string is returned to encoder 3 as a new collating character string (112). Since "likes" is also not registered in the dictionary 4 (Table 2), one character "s" at the tail is stored (111), and at the same time, the character string "like" excluding the last character is returned to collator 3 as a new character string (112). Collator 3 collates the collating character string with dictionary 4. In case of a character string which may be a word tail, even if there is no space (_) at the tail of collating character string, this character string is assumed to be the same one having the space, and then, is compared whether or not coincides with the contents of the dictionary 4. Simultaneously, it is reported to output portion 6 that there is no space (_) at the tail of collating character string. Accordingly, the collating character string "like" is judged that it coincides with the registered word "like_" in the dictionary 4 and is therefore transmitted to the output portion 6.

At the output portion 6, the code (110101010110) of the character string "like_" registered in the dictionary 4 is output (124) after the deletion code (1110100) is added to it (116), since (1) the collating character string "like" is the character string that may be a word tail (113), (2) there is no space (_) at its tail (114), and (3) no special symbol is succeeding to it (115).

The first 4 letters in the word "likes_" have been encoded and output as mentioned above, but the tail "s_" has been kept yet, then this is extracted (126), and transmitted to collator 3. In dictionary 4 there is "s" but since this is not the character string ("s_") that may be a word tail, it is assumed not to be coincided (104), and this will be informed to the non-coincidence processor 5. The non-coincidence processor 5 stores this space (_) at the tail (111), and returns character "s" to collator 3. Since the character "s" is registered in the dictionary 4 (Table 2), it is transmitted to output portion 6. Due to the fact that it is not a character string that may be a word tail, it is output as a code as it is (0111).

In addition, the tail space (_) stored in the non-coincidence processor 5 is extracted (126) and is then returned to the collator 3. Since the space (_) is registered in the dictionary 4 (Table 2), its code (11001) is output in the same manner. Thus, encoding the initial collating word "likes_" is completed (125).

The next collating word "CAN" and the next one character "." are extracted by word extractor 2 (102) and are transmitted to collator 3, but since the collating word "CAN" does not exist in dictionary 4 (Table 2), they are transmitted to the non-coincidence processor 5. After all the letters are converted from capital to small letters, i.e., "can" (109), they are returned to collator 3 again. At this time since there is the character string "can_" containing the word tail in dictionary (Table 2), ignoring the space at the tail in the same manner as collating "like", "can" is judged that it coincides with the registered word "can_" in dictionary 4 (104). Simultaneously, it is reported to the output portion 6 that the space (_) is lacking at the tail.

At the output portion 6, collating word "can" is the character string that may be a word tail (113). Nevertheless, there is in fact no space (_) at the tail (114) and a special symbol (period ".") is succeeding to (115). Therefore the deletion code is not added. However, since the current collating word "can" is the one whose original collating word was converted from capital to small letters entirely (122), the letter string conversion code ($b_3$=1101001111) is added and then the code (10100000101) of "can_" registered in the dictionary 4 is output (124).

Finally, the tail character "." of a document is extracted by word extractr 2 and is then collated with the dictionary 4 at the collator 3. In the dictionary 4, "." is registered. Since the period "." is not a character string which may be a word tail (113), and there is no record of conversion from capital to small letter (120 and 122), the code (1111100) registered in the dictionary 4 is output as it is (124).

Thus, the encodement of the transmitting document composed of 18 letters (The man likes a CAN.) has been completed in total 82 bits (127).

When a space (_) is succeeding to a character string that may be a word tail and a special symbol is further succeeding to said space (_), in order that an intermediate space is not lost, said space (_) is stored at the non-coincidence processor 5 as a tail character (118).

In addition, a special symbol is one of the non-alphabet characters immediately succeeding to a character string composed of an alphabet letter (without any space lying between them) and includes comma (,), dot (.), question-mark (?), hyphen (-), colon (:), semicolon (;), slash (/), exclamation mark (!), apostrophe ('), quotation marks ("), or others. It is assumed to be defined between a transmitter and a receiver prior to their communication.

In the description hereinbefore, a word is assumed to be a series of character strings composed of only alphabet, but it is needless to say that a "word" may be composed of a series of character string containing a special symbol, a figure, and/or a capital alphabet, and moreover, multiple word strings may be registered as a "word". In this case, word extractor 2 can also take a character string by the unit over one "word" registered in the dictionary 4.

In addition, in this embodiment, when a character string containing a capital letter is not coincided with dictionary 4 after the conversion from capital to small letter, the status is returned instantaneously to the one prior to this conversion. This is, however, not always necessary, and the coincidence relation with the dictionary 4 may be continuously checked by proceeding to delete a tail character without returning to the prior status. If this is the case, for one of the character strings, it is needless to say that there is a possibility to have an attachment of both the headletter conversion code (or letter string conversion code) and the deletion code.

For a character string that may be a word tail, although a space (_) is added to this string tail and this string is then registered in the above embodiment, it is not necessarily to do so. If the mark which denotes a character string that may be a word tail is attached and is used to identify from others, it is similarly needless to say that the space at the tail can be processed automatically.

Figure 4:
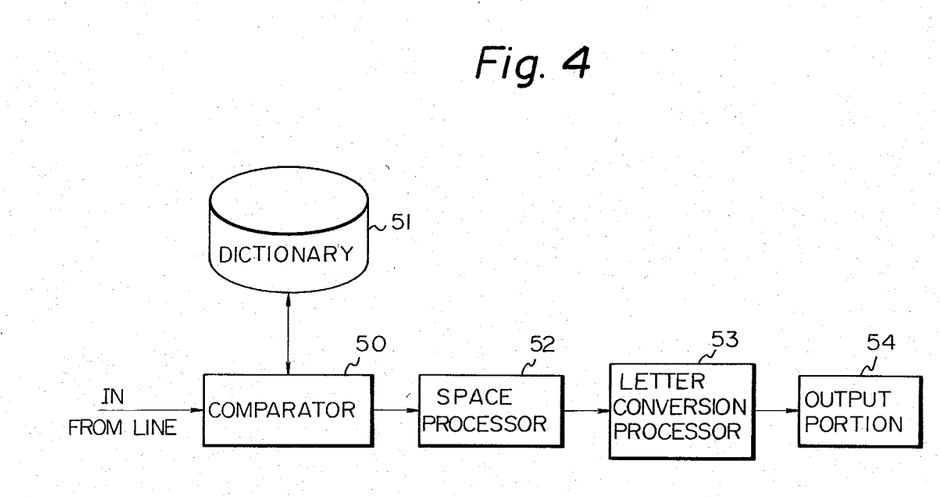
FIG. 4 is a block diagram of the receiver in accordance with the present invention.

FIG. 4 is a block diagram of the receiver.

Figure 5:
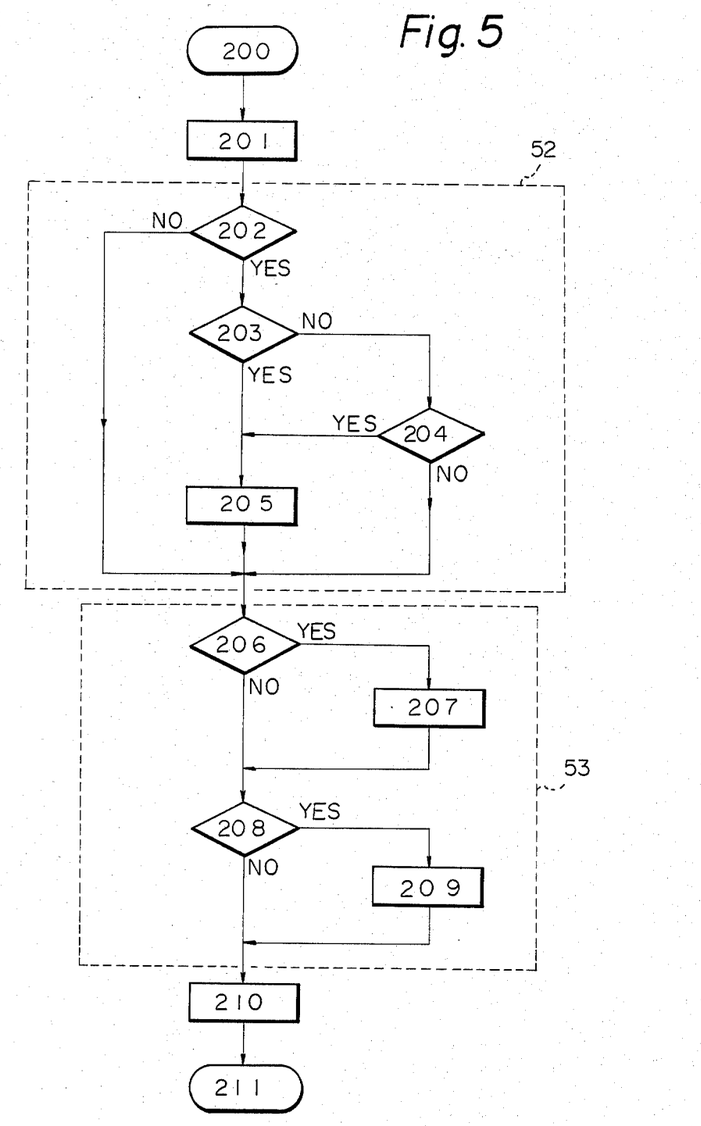
FIG. 5 is a flow diagram describing the motions in FIG. 4.

FIG. 5 is a flow diagram explaining the operation of each portion in FIG. 4.

Table 3 is a table explaining the contents of operation at each portion in FIG. 5.

A code which is received is input to the collator 50 and the word coincided is extracted through the query to the dictionary 51. Said coincided word is transmitted to the space processor 52, and is processed whether to remain a space (_) at the tail of character string at a word tail or not, furthermore, after being processed whether to convert the headletter or entire letters from capital to small letters or not at letter conversion processor 53, said coincided word is finally, for example, printed out at output portion 54 as a receiving document.

Now, the following is the more detailed description of the reception operation relating to the document in FIG. 3.

When the receiving code string (11101100100010110 . . . ) is input to the collator 50, the collator 50 queries this to the dictionary 51 and acknowledges that the receiving code string is composed of "headletter conversion code ($b_1$), the_, man_, deletion code ($b_2$), like_, s,_(space), letter string conversion code ($b_3$), can_, and period(.)" (201, Table 2).

At first, said headletter conversion code ($b_1$) is sent to the space processor 52 and to the letter conversion processor 53 but there is no output from them (210). When the next word "the_" is sent to the space processor 52, it is sent to the letter conversion processor 53 as it is without deleting a tail space (205) for the following reasons: (1) This is a character string that may be a word tail (202), (2) one character immediately succeeding to is "m" which is not any special symbol (203), and finally (3) deletion code is not attached to this (204). At the headletter conversion processor 53, since the headletter conversion processing code ($b_1$) is attached to word "the_" (206) but the letter string conversion code is not attached (208), word "The_" is output (210) after said head character is converted from "t" to "T" (207).

Since the next word "man_" is a character string that may be a word tail (202) and is not succeeded by any special symbol (203), and is not attached by the deletion code (204), it is transmitted to the letter conversion processor 53 as it is. Furthermore, since neither the headletter conversion code nor the letter string conversion code is attached (206 and 208), the word "man_" is output as a receiving document as it is (210).

TABLE 3

| No. | CONTENTS |
|---|---|
| 200 | Start |
| 201 | Collate with dictionary and extract the coincided word |
| 202 | Is this a character string that appear at a word tail ? |
| 203 | Is any special symbol succeeding to immediately ? |
| 204 | Is deletion code attached ? |
| 205 | Delete one of the tail spaces |
| 206 | Is headletter conversion code attached ? |
| 207 | Convert head character from small letter to capital letter |
| 208 | Is letter string conversion code attached ? |
| 209 | Convert the entire character string from small letters to capital letters |
| 210 | Print out the received document |
| 211 | End |

In the next stage, the deletion code ($b_2$) is sent to the space processor 52 and to the letter conversion processor 53. Same as in the case of the headletter conversion code ($b_1$), nothing is output from themselves (210). When the next word "like_" is sent to the space processor 52, its tail space (_) is deleted and it is converted to "like" (205) for the following reasons: (1) it is a character string that appears at a word tail (202), (2) one character immediately succeeding to is "s" which is not any special character (203), and (3) it has the deletion code preceeding immediately and is being attached (204). The "like" is transmitted to the letter conversion processor 53. It is output as "like" as it is (210) since it is not attached by the headletter conversion code nor the letter string conversion code (206 and 208).

Since the next one character "s" has no space at its tail and is not a character string at a word tail, it is sent to the letter conversion processor 53. Furthermore since it is not attached by both the letter conversion code nor the letter string conversion code (206 and 208), it is output as "s" as it is (210). The next one character "_" is also output as "_" as it is in the same manner for "s".

A letter string conversion code ($b_3$) appearing next, is not output directly (210). When the next word "can_" is sent to the space processor 52, its tail space (_) is deleted and it is converted to "can" (205) for the reasons: (1) it is a character string that may be a word tail (202), (2) one character immediately succeeding to is "." and (3) this is a special character (203). Moreover, "can" is sent to the letter conversion processor 53. Since the headletter conversion code is not attached (206) but the letter string conversion code is attached (208), its character string is entirely converted from small letters to capital letters (209) and is output as "CAN" (210).

The next one character "." is output as "." as it is, since it is not a character string that may be a word tail (202) and both the headletter conversion code and the letter string conversion code are not attached (206 and 208).

Thus, the receiving signals are entirely decoded and are output to output portion 6 in the way described above. In this embodiment, it is ensured that "The_man_likes_CAN." is printed out and that the transmitting document is correctly reproduced.

In this embodiment, although the headletter conversion code, deletion code, or letter string conversion code is inserted in the position immediately preceeding to the character string to be processed, it is unnecessary to say that this insertion can be provided to the position immediately succeeding to the character string to be processed.

It is also needless to say that said compact code table depends upon not only the numbers of the character strings to be registered in the dictionary and/or of the control codes, but also a document. In addition, it is apparent that the encoding efficiency can be enhanced if it is allowed to register the terms to be used frequently in the user's specific field into a part of compact code table.

There is the advantage that this invention makes it possible to reduce redundancy contained within a document and to communicate an arbitrary document with lower cost and with high fidelity.

From the foregoing it will now be apparent that a new and message communication system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A message communication process between a transmission side and a reception side comprising the steps of:
   at the transmission side, comparing for all of the characters in a message, a character string of the message to be transmitted with a dictionary, and encoding all of said character string into a variable length compact code according to the content of the dictionary,
   sending the encoded compact code to the reception side,
   at the reception side, decoding the encoded compact code with a dictionary having the same content as the dictionary of the transmission side,
   wherein said dictionary is an electronically controlled dictionary with a memory.

2. A message communication process according to claim 1, wherein said character string includes a 'space' code following a word, and the combination of said word and a 'space' code is encoded into a single compact code.

3. A message communication process according to claim 1, wherein a first conversion code, for converting a small letter to a capital character at the beginning of a word, is defined, and the reception side converts the beginning character to a capital character upon receipt of said conversion code.

4. A message communication process according to claim 1, wherein a second conversion code converts all small letters to the capital characters and the reception side converts all the characters associated with the code to the capital characters upon receipt of said second code.

5. A message communication process according to claim 1, wherein said compact code is selected according to a statistical nature of a document so that the length of a compact code is selected according to the appearance frequency of a string.

* * * * *